United States Patent
Bhatia et al.

[11] Patent Number: 5,921,087
[45] Date of Patent: Jul. 13, 1999

[54] METHOD AND APPARATUS FOR COOLING INTEGRATED CIRCUITS USING A THERMOELECTRIC MODULE

[75] Inventors: Rakesh Bhatia, San Jose; Robert D. Padilla, Milpitas; James G. Hermerding, II, San Jose, all of Calif.

[73] Assignee: Intel Corporation, Santa Clara, Calif.

[21] Appl. No.: 08/844,769

[22] Filed: Apr. 22, 1997

[51] Int. Cl.$^6$ ............................ F25B 21/02; H01L 35/28; F28F 7/00

[52] U.S. Cl. ................................ 62/3.2; 62/3.3; 62/3.7; 136/203; 136/204; 165/80.2; 165/80.3

[58] Field of Search ...................... 257/712, 713, 257/721, 223; 165/80.2, 80.3; 62/259.2, 3.2, 3.3, 3.7; 361/688, 689, 690, 691, 692, 693, 694, 696, 697; 136/203, 204

[56] References Cited

U.S. PATENT DOCUMENTS

| | | | |
|---|---|---|---|
| 2,984,077 | 5/1961 | Gaskill | ................................ 165/80.2 |
| 4,253,515 | 3/1981 | Swiatosz. | |
| 4,279,292 | 7/1981 | Swiatosz. | |
| 4,855,810 | 8/1989 | Gelb et al.. | |
| 5,032,897 | 7/1991 | Mansuria et al.. | |
| 5,156,004 | 10/1992 | Wu et al.. | |
| 5,411,599 | 5/1995 | Horn et al.. | |
| 5,419,780 | 5/1995 | Suski | ...................................... 136/205 |
| 5,439,528 | 8/1995 | Miller. | |
| 5,448,109 | 9/1995 | Cauchy. | |
| 5,637,921 | 6/1997 | Burward-Hoy | ........................ 165/80.2 |

FOREIGN PATENT DOCUMENTS

| | | |
|---|---|---|
| 1-295449 | 11/1989 | Japan. |
| 3-201552 | 9/1991 | Japan. |
| 4-216655 | 8/1992 | Japan. |
| 5-47996 | 2/1993 | Japan. |

OTHER PUBLICATIONS

"Frequently asked questions about Peltier effect:" http://aoc–cooler.com/Peltier–Effect.htm; (Date Printed Feb. 19, 1997).

"An intuitive introduction to three effects in thermoelectricity:" http://schottky.ucsd.edu/~felix/peltier.html; (Date Printed Feb. 19, 1997).

"Melcor. World Leader in Thermoelectrics" http://www.melcor.com/thermoelectrics.html; (Date Printed Feb. 19, 1997).

"HZ–2 is not yet in production" http://www.hi–z.com/websit02.html; (Date Printed Jul. 30, 1996).

*Primary Examiner*—Henry A. Bennett
*Assistant Examiner*—Melvin Jones
*Attorney, Agent, or Firm*—Blakely, Sokoloff, Taylor & Zafman

[57] ABSTRACT

An integrated circuit cooling device in which a thermoelectric module (TEM) is built into a printed circuit board (PCB) so that the TEM converts heat generated by an integrated circuit on the PCB into DC power that is then supplied to a DC—DC regulator to drive a cooling fan. In one embodiment, the cooling fan is incorporated within a heat sink disposed on one side of the PCB so that the built-in TEM is between the heat sink and the integrated circuit being cooled. In an alternate embodiment, the cooling fan is located remotely from the heat sink.

13 Claims, 3 Drawing Sheets

METHOD AND APPARATUS FOR COOLING INTEGRATED CIRCUITS USING A THERMOELECTRIC MODULE

BACKGROUND OF THE INVENTION

1. Field of the Invention

The present invention pertains to the field of integrated circuits. More particularly, this invention relates to cooling an integrated circuit on a printed circuit board (PCB) with little or no external power needed for cooling.

2. Background

Advances in integrated circuit technology have led to faster clock frequencies and greater densities of transistors. These increases result in a corresponding increase in heat generated by integrated circuits. With large amounts of heat being generated, cooling becomes a problem.

Advances in integrated circuit technology have also led to smaller, more portable computer platforms like notebook computers. Portability depends in part on power consumption. The longer a notebook computer can operate on its battery, the more portable the notebook computer is. Therefore, reducing the amount of power consumed for cooling is also important.

Typically, integrated circuits are cooled by either active or passive cooling devices. An active cooling device is defined as a cooling device that uses additional power in the system being cooled, where a passive cooling device does not use additional power. The ability of a passive device, such as a heat sink mounted onto an integrated circuit package body to dissipate heat, is constrained by its size. Thus a passive device for use in a notebook computer is constrained in its ability to dissipate heat. An active cooling device, such as a fan, can be used to dissipate larger amounts of heat by blowing air across the integrated circuit or heat sink. As the integrated circuit generates more heat and a larger heat sink is employed, greater air flow is required. Unfortunately, to increase air flow, more power is consumed.

Thermoelectric modules (TEM) have been used as active cooling devices. By placing a TEM between an integrated circuit and a heat sink and supplying the TEM with a current, the TEM transfers heat from the integrated circuit to the heat sink. The phenomenon is called the Peltier effect. The TEM consists of ceramic plates with p-type semiconductor material and n-type semiconductor material between the plates. The elements of semiconductor material are connected electrically in series. When a DC voltage is applied to the semiconductor material, electrons pass from the p-type material to the n-type material. The elements are arranged in a manner such that when a DC voltage is applied, heat is transferred from one side of the TEM to the other. The rate of transfer is proportional to the current and the number of p-n junctions. Unfortunately, active cooling using a TEM also consumes additional power.

Thus, a cooling solution for cooling an integrated circuit device, such as those employed in notebook computers that reduce the consumption of battery or line power, is needed.

SUMMARY OF THE INVENTION

In the present invention, a TEM is built into a PCB so that the TEM converts heat generated by an integrated circuit on the PCB into DC power that is then supplied to a DC—DC regulator to drive a cooling fan. In one embodiment, the cooling fan is incorporated within a heat sink disposed on one side of the PCB so that the built-in TEM is between the heat sink and the integrated circuit being cooled. In an alternate embodiment, the cooling fan is located remotely from the heat sink.

DETAILED DESCRIPTION

In the following detailed description numerous specific details are set forth in order to provide a thorough understanding of the present invention. However, it will be understood by those skilled in the art that the present invention may be practiced without these specific details. In other instances well known methods, procedures, components, and circuits have not been described in detail so as not to obscure the present invention.

Figure 1:
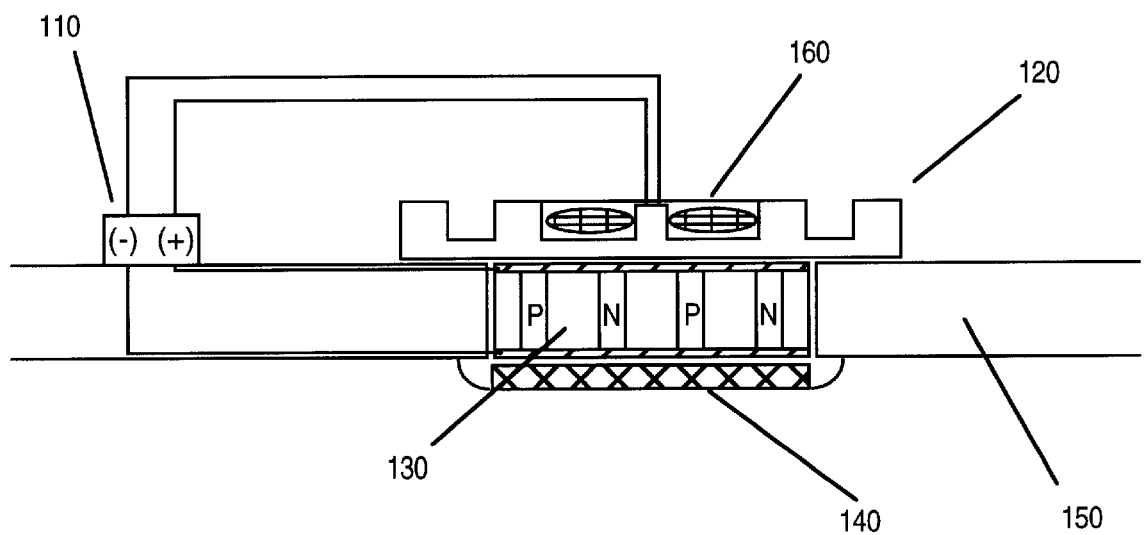
FIG. 1 is a cross-sectional view of one embodiment of an integrated circuit system implemented in accordance with the present invention.

FIG. 1 illustrates one embodiment of the present invention. As shown, TEM 130 is advantageously built-in or incorporated into the PCB 150. In one embodiment, TEM 130 is formed in a predetermined area of PCB 150 as PCB 150 is formed. In an alternate embodiment, TEM 130 and PCB 150 are formed separately, with PCB 150 having a cavity or hollowed portion that is complementary in dimension to TEM 130. TEM 130 is snuggedly fitted into the cavity or hollowed portion of PCB 150. CPU 140 is attached to the PCB 150 where the TEM 130 has been incorporated so that CPU 140 is contacting the "cool side" of TEM 130. Any other heat generating integrated circuit could be used in place of the CPU 140. For the illustrated embodiment, heat sink 120, with an incorporated cooling fan 160, is also attached to the PCB 150, opposite the CPU 140. In other words, TEM 130 is between the CPU 140 and the heat sink 120.

Heat from the CPU 140 is converted to DC current by the TEM 130. The DC—DC regulator 110 fixes the DC current and supplies it to the embedded cooling fan 160. In this manner, heat as a byproduct from the CPU 140 is used to cool the system so that, unlike the prior art, additional power is not used to run the fan 160. Essentially, the TEM 130, the DC—DC regulator 110, the fan 160, and the heat sink 120 operate together as a passive cooling device for the CPU 140. Except for the fan, the entire system is solid state with no moving parts.

Figure 2:
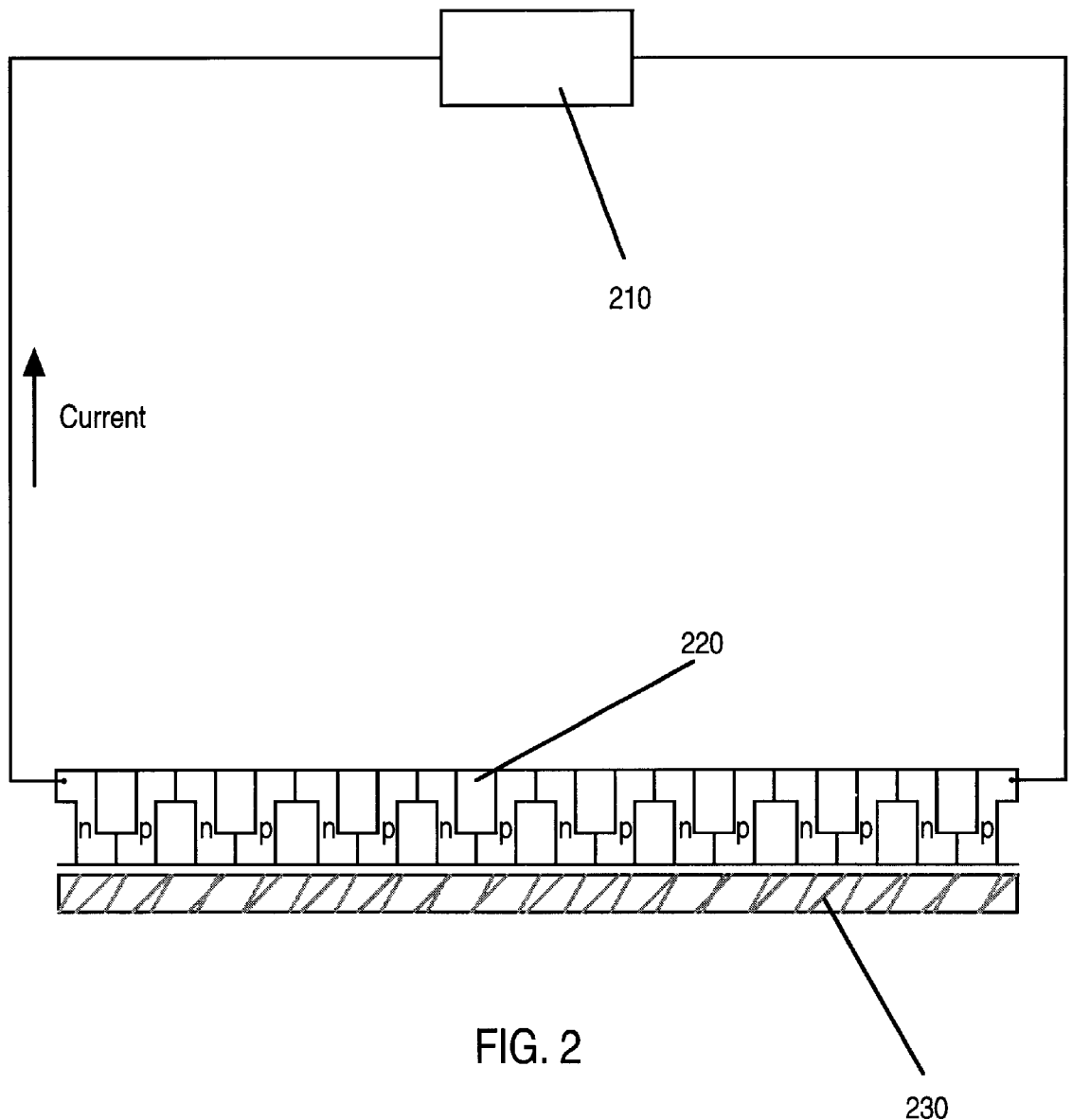
FIG. 2 is a cross-sectional view of an illustrative TEM DC current source.

FIG. 2 is merely an illustration to describe how the Seebeck effect in a TEM is used to convert heat into DC power. The TEM 220 comprises multiple p-n junctions connected electrically in series. The circuit is completed through load 210, which is the DC—DC regulator 110 and cooling fan 160 in FIG. 1. Pairs of p-n junctions are connected thermally in parallel. In other words, if one side of TEM 220 is hot, every second junction is hot. At the p-n junctions, electrons naturally migrate from the n-type semiconductor material to the p-type semiconductor material to reach an equilibrium. This creates an electric field across the junctions, but as long as all the junctions are at the same temperature, no net current gain is achieved. When heat source 230 is hot, though, the temperature of every second junction increases. Electrons at those junctions have more kinetic energy so more electrons migrate creating a larger electric field. The other junctions are cooler, so a Seebeck DC current develops between the cool and hot junctions in response to the different electric field magnitudes at the hot and cool junctions. By orienting the junctions as shown in FIG. 2, the amount of current produced in the circuit is proportional to the number of junctions in series and the temperature difference between the hot and cool junctions.

The Seebeck effect is the opposite of the Peltier effect. Seebeck is the conversion of heat to DC power. Peltier is the creation of a temperature differential by applying a DC current. The Peltier effect is used in the prior art in an active cooling device.

Currently, p-type and n-type bismuth telluride are used for the dissimilar conductive materials, although other pairs of dissimilar conductive materials can be used. Bismuth telluride TEMs currently have conversion efficiencies of 5% and higher. As an example then, a CPU 140 dissipating 10 W of heat can be converted to 0.5 W of DC power by TEM 130. The DC—DC regulator 110 can supply a fixed 0.5 W, which is enough to run a typical 20 or 25 mm fan in a notebook computer.

Figure 3:
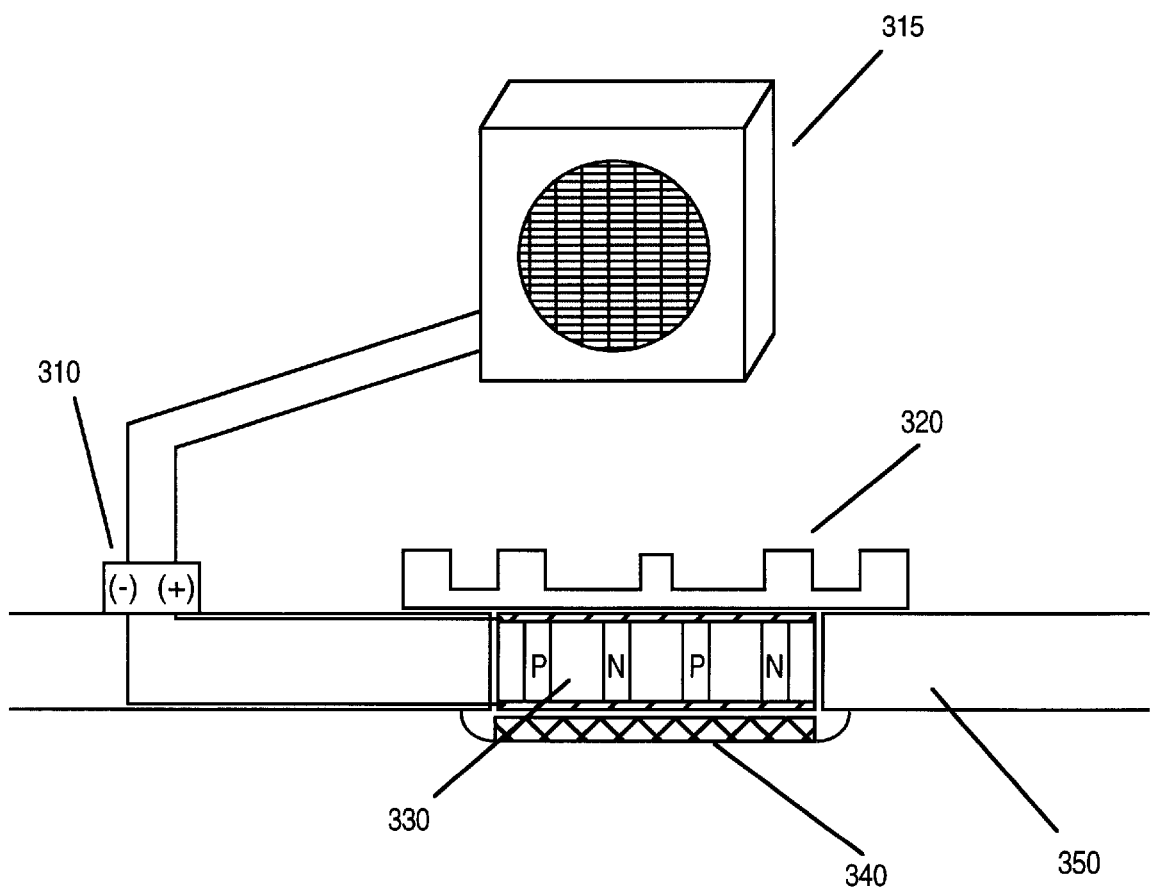
FIG. 3 is a cross-sectional view of an alternate embodiment of an integrated circuit system implemented in accordance with the present invention.

FIG. 3 shows another embodiment of the cooling apparatus with a remote cooling fan 315 rather than a fan incorporated into the heat sink 320. The remote fan can be used to cool other components in the system too. Thus, heat from an IC which requires little or no cooling can be used to cool other components in the system.

As discussed earlier, the TEM can be incorporated into the PCB either during the manufacturing of the PCB, layer by layer, or by removing a section of the PCB and inserting the TEM. In either case, the cooling system can be quite cost effective in bulk. As a result, for little additional cost, an integrated circuit can be efficiently cooled without wasting battery power or line power. The savings is especially important in notebook computers.

Whereas many alterations and modifications of the present invention will be comprehended by a person skilled in the art after having read the foregoing description, it is to be understood that the particular embodiments shown and described by way of illustration are in no way intended to be considered limiting. Therefore, references to details of particular embodiments are not intended to limit the scope of the claims, which in themselves recite only those features regarded as essential to the invention.

What is claimed is:

1. An apparatus comprising:

a printed circuit board (PCB);

a thermoelectric module (TEM) incorporated into the PCB, said TEM to receive heat generated by an integrated circuit (IC) coupled to the TEM and to convert the heat into output DC power; and a cooling fan, at least partially operated by the output DC power, to blow air across the IC.

2. The apparatus of claim 1, further comprising:

a heat sink to couple to the PCB on a first side of the PCB, wherein the IC is to couple to the PCB on a second side opposite the heat sink.

3. The apparatus of claim 2, wherein the cooling fan is incorporated into the heat sink.

4. The apparatus of claim 1, wherein the cooling fan is located remotely from the heat sink.

5. The apparatus of claim 1, wherein the PCB and the TEM comprise a continuous planar board, and the TEM comprises a predetermined area in the continuous planar board.

6. The apparatus of claim 1, wherein the PCB comprises a hollowed opening, and wherein the TEM snuggedly incorporates into the hollowed opening.

7. The apparatus of claim 1, wherein the TEM comprises:

a plurality of p-n junction pairs electrically coupled in series, wherein each p-n junction pair comprises a p-type semiconductor material and an n-type semiconductor material electrically coupled in series, wherein the p-n junction pairs generate DC current in response to a heat differential between a first side and a second side of the TEM.

8. The apparatus of claim 7, wherein the TEM is comprised of p-type and n-type bismuth telluride semiconductor material.

9. The apparatus of claim 7, further comprising:

at least one pair of leads which extend from the TEM, wherein the leads supply the DC current from the p-n junction pairs.

10. A method comprising:

incorporating a thermoelectric module (TEM) into a printed circuit board (PCB);

attaching an integrated circuit (IC) to the TEM of the PCB;

converting heat from the IC into DC power using the TEM;

supplying the DC power to a cooling fan; and blowing air from the cooling fan to cool the IC.

11. The method of claim 10, wherein the air is blown across a heat sink coupled to the PCB on a side opposite the integrated circuit.

12. The method of claim 10 wherein the incorporating the TEM comprises:

forming the TEM in a predetermined area of the PCB as the PCB is formed.

13. The method of claim 10 wherein the incorporating the TEM comprises:

forming an opening in the PCB; and snuggedly fitting the TEM into the opening.

* * * * *